United States Patent
Gaur

(10) Patent No.: US 8,020,065 B1
(45) Date of Patent: Sep. 13, 2011

(54) PACKET ENCODING METHOD TO PROVIDE UNEQUAL ERROR PROTECTION TO USERS AND/OR APPLICATIONS DATA

(75) Inventor: Sudhanshu Gaur, Campbell, CA (US)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/727,553

(22) Filed: Mar. 19, 2010

(51) Int. Cl.
*H03M 13/00* (2006.01)
(52) U.S. Cl. .................. 714/755; 714/752; 714/758
(58) Field of Classification Search .......... 714/752, 714/755, 758
See application file for complete search history.

(56) References Cited

U.S. PATENT DOCUMENTS

| 6,405,338 | B1 * | 6/2002 | Sinha et al. | 714/752 |
| 2010/0100789 | A1 * | 4/2010 | Yu et al. | 714/752 |

OTHER PUBLICATIONS

G. Takahara et al., "Constellation Mappings for Two-Dimensional Signaling of Nonuniform Sources", IEEE Transactions on Communications, vol. 51, No. 3, Mar. 2003.

* cited by examiner

*Primary Examiner* — Sam Rizk
(74) *Attorney, Agent, or Firm* — Mattingly & Malur, P.C.

(57) ABSTRACT

Embodiments of the invention provide a packet encoding scheme to ensure unequal error protection to different bits in a packet or in multiple packets. In one embodiment, a method to process bits in a bit stream comprises scrambling the bit stream; separating the scrambled bit stream into a high priority bit stream with an order of high priority bits from left to right and a low priority bit stream with an order of low priority bits from left to right; rearranging the bits by embedding the high priority bits in the low priority bit stream while preserving the two orders, the rearranged bit stream including blocks of bits, each block including one or more high priority bits disposed left of corresponding one or more low priority bits to provide protection for the high priority bits against noise which is at least equal to protection for the low priority bits; and modulating the rearranged bit stream using Gray encoding method to produce an encoded bit stream.

20 Claims, 6 Drawing Sheets

(a) Original bit stream (b) Modified bit stream (a) Transmitter (b) Receiver

PACKET ENCODING METHOD TO PROVIDE UNEQUAL ERROR PROTECTION TO USERS AND/OR APPLICATIONS DATA

BACKGROUND OF THE INVENTION

The present invention relates generally to communications systems and, more particularly, to a packet encoding scheme to provide unequal error protection for different bits.

In a communication system, some of the transmitted information bits require more protection than others (for example, header bits are more important than payload bits, and I-frames are more important compared to P/B-frames in MPEG video streaming). To achieve this, one of the several known techniques can be employed such as forward-error-correction (FEC) applied unequally, packet retransmissions, etc. These techniques may be used to provide unequal error protection for different packets but are not suitable to provide unequal error protection to the bits in one packet.

BRIEF SUMMARY OF THE INVENTION

Embodiments of the invention provide a packet encoding scheme to ensure unequal error protection to different bits in a packet or in multiple packets. In one embodiment, the structure of Gray encoding is used to ensure unequal error protection for different bits. Different from the convention encoding scheme, the packet encoding scheme generates a symbol using a mix of high priority and low priority bits. The scheme has insignificant complexity and can provide a higher probability of detection of header bits in a packet. Also, it can provide a higher degree of protection against noise corruption to important frames such as control packets, I-frames in MPEG transmission, and the like.

In accordance with an aspect of the present invention, a method to process bits in a bit stream comprises scrambling the bit stream; separating the scrambled bit stream into separate high priority bits and low priority bits to form a high priority bit stream and a low priority bit stream, the high priority bit stream having an order of high priority bits from left to right and the low priority bit stream having an order of low priority bits from left to right; rearranging the bits by embedding the high priority bits from the high priority bit stream in the low priority bit stream to form a rearranged bit stream while preserving the order of the high priority bits and the order of the low priority bits in the rearranged bit stream, the rearranged bit stream including blocks of bits, each block including one or more adjacent high priority bits disposed left of corresponding one or more adjacent low priority bits in order to provide protection for the high priority bits against noise which is at least equal to protection for the low priority bits in the block; modulating the rearranged bit stream using Gray encoding method to produce an encoded bit stream; and transmitting the encoded bit stream to a communication medium.

In some embodiments, bits-to-symbol mapping of the encoded bit stream provides a constellation map having edge symbols and non-edge symbols, each symbol including a plurality of bits; and probability of correction detection for the bits in each edge symbol is highest for the leftmost bit and decreases from left to right to lowest for the rightmost bit. At least one block of bits in the rearranged bit stream includes one or more adjacent high priority bits from most significant bits of the bit stream and corresponding one or more adjacent low priority bits from least significant bits of the bit stream. Rearranging the bits comprises generating blocks of M bits wherein M is constellation size representing bits per symbol, each block of M bits including the one or more adjacent high priority bits to the left of the corresponding one or more adjacent low priority bits. The bit stream may comprise a packet having header bits and payload bits, the header bits being high priority bits, the payload bits being low priority bits. The bit stream may comprise a high priority packet having the high priority bits and a low priority packet having the low priority bits.

In specific embodiments, the method further comprises receiving an input encoded bit stream from the communication medium, the input encoded bit stream including a plurality of high priority encoded bits embedded in a plurality of low priority encoded bits, the high priority encoded bits having an input order of high priority bits from left to right, the a low priority encoded bits having an input order of low priority bits from left to right; demodulating the input encoded bit stream to produce a decoded bit stream; separating the decoded bit stream into separate high priority decoded bits and low priority decoded bits to form a high priority decoded bit stream and a low priority decoded bit stream while preserving the input order of the high priority bits in the high priority decoded bit stream and the input order of the low priority bits in the low priority decoded bit stream, generating a serial bit stream with the high priority decoded bit stream which is followed by the low priority decoded bit stream; and descrambling the serial bit stream.

In accordance with another aspect of the invention, a system to process bits in a bit stream comprises a scrambler to scramble the bit stream; a transmitter separation module to separate the scrambled bit stream into separate high priority bits and low priority bits to form a high priority bit stream and a low priority bit stream, the high priority bit stream having an order of high priority bits from left to right and the low priority bit stream having an order of low priority bits from left to right; a transmitter rearranging module to rearrange the bits by embedding the high priority bits from the high priority bit stream in the low priority bit stream to form a rearranged bit stream while preserving the order of the high priority bits and the order of the low priority bits in the rearranged bit stream, the rearranged bit stream including blocks of bits, each block including one or more adjacent high priority bits disposed left of corresponding one or more adjacent low priority bits in order to provide protection for the high priority bits against noise which is at least equal to protection for the low priority bits in the block; a modulation mapper to modulate the rearranged bit stream using Gray encoding method to produce an encoded bit stream; and a transmitter to transmit the encoded bit stream to a communication medium.

In some embodiments, the system further comprises a receiver to receive an input encoded bit stream from the communication medium, the input encoded bit stream including a plurality of high priority encoded bits embedded in a plurality of low priority encoded bits, the high priority encoded bits having an input order of high priority bits from left to right, the a low priority encoded bits having an input order of low priority bits from left to right; a demodulation module to demodulate the input encoded bit stream to produce a decoded bit stream; a receiver separation module to separate the decoded bit stream into separate high priority decoded bits and low priority decoded bits to form a high priority decoded bit stream and a low priority decoded bit stream while preserving the input order of the high priority bits in the high priority decoded bit stream and the input order of the low priority bits in the low priority decoded bit stream; a receiver rearranging module to generating a serial bit stream with the high priority decoded bit stream which is followed by the low priority decoded bit stream; and a descrambler to descramble the serial bit stream.

Another aspect of the invention is directed to a computer-readable storage medium storing a plurality of instructions for controlling a data processor to process bits in a bit stream. The plurality of instructions comprise instructions that cause the data processor to scramble the bit stream; instructions that cause the data processor to separate the scrambled bit stream into separate high priority bits and low priority bits to form a high priority bit stream and a low priority bit stream, the high priority bit stream having an order of high priority bits from left to right and the low priority bit stream having an order of low priority bits from left to right; instructions that cause the data processor to rearrange the bits by embedding the high priority bits from the high priority bit stream in the low priority bit stream to form a rearranged bit stream while preserving the order of the high priority bits and the order of the low priority bits in the rearranged bit stream, the rearranged bit stream including blocks of bits, each block including one or more adjacent high priority bits disposed left of corresponding one or more adjacent low priority bits in order to provide protection for the high priority bits against noise which is at least equal to protection for the low priority bits in the block; and instructions that cause the data processor to modulate the rearranged bit stream using Gray encoding method to produce an encoded bit stream.

These and other features and advantages of the present invention will become apparent to those of ordinary skill in the art in view of the following detailed description of the specific embodiments.

DETAILED DESCRIPTION OF THE INVENTION

Figure 1:
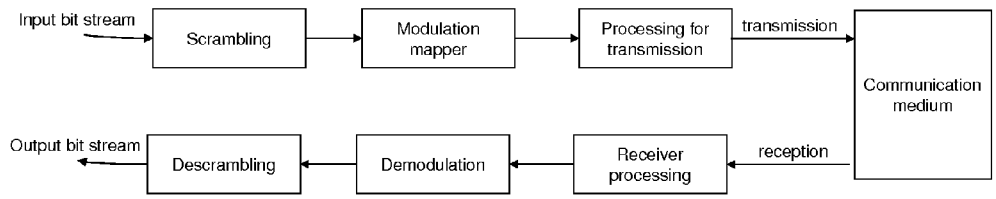
FIG. 1 shows an example of a typical communication system having a bit scrambler followed by a modulation mapper.

In the following detailed description of the invention, reference is made to the accompanying drawings which form a part of the disclosure, and in which are shown by way of illustration, and not of limitation, exemplary embodiments by which the invention may be practiced. In the drawings, like numerals describe substantially similar components throughout the several views. Further, it should be noted that while the detailed description provides various exemplary embodiments, as described below and as illustrated in the drawings, the present invention is not limited to the embodiments described and illustrated herein, but can extend to other embodiments, as would be known or as would become known to those skilled in the art. Reference in the specification to "one embodiment", "this embodiment", or "these embodiments" means that a particular feature, structure, or characteristic described in connection with the embodiment is included in at least one embodiment of the invention, and the appearances of these phrases in various places in the specification are not necessarily all referring to the same embodiment. Additionally, in the following detailed description, numerous specific details are set forth in order to provide a thorough understanding of the present invention. However, it will be apparent to one of ordinary skill in the art that these specific details may not all be needed to practice the present invention. In other circumstances, well-known structures, materials, circuits, processes and interfaces have not been described in detail, and/or may be illustrated in block diagram form, so as to not unnecessarily obscure the present invention.

In the following description, relative orientation and placement terminology, such as the terms horizontal, vertical, left, right, top and bottom, is used. It will be appreciated that these terms refer to relative directions and placement in a two dimensional layout with respect to a given orientation of the layout. For a different orientation of the layout, different relative orientation and placement terms may be used to describe the same objects or operations.

Furthermore, some portions of the detailed description that follow are presented in terms of algorithms and symbolic representations of operations within a computer. These algorithmic descriptions and symbolic representations are the means used by those skilled in the data processing arts to most effectively convey the essence of their innovations to others skilled in the art. An algorithm is a series of defined steps leading to a desired end state or result. In the present invention, the steps carried out require physical manipulations of tangible quantities for achieving a tangible result. Usually, though not necessarily, these quantities take the form of electrical or magnetic signals or instructions capable of being stored, transferred, combined, compared, and otherwise manipulated. It has proven convenient at times, principally for reasons of common usage, to refer to these signals as bits, values, elements, symbols, characters, terms, numbers, instructions, or the like. It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "processing", "computing", "calculating", "determining", "displaying", or the like, can include the actions and processes of a computer system or other information processing device that manipulates and transforms data represented as physical (electronic) quantities within the computer system's registers and memories into other data similarly represented as physical quantities within the computer system's memories or registers or other information storage, transmission or display devices.

The present invention also relates to an apparatus for performing the operations herein. This apparatus may be specially constructed for the required purposes, or it may include one or more general-purpose computers selectively activated or reconfigured by one or more computer programs. Such computer programs may be stored in a computer-readable storage medium, such as, but not limited to optical disks, magnetic disks, read-only memories, random access memories, solid state devices and drives, or any other types of media suitable for storing electronic information. The algorithms and displays presented herein are not inherently related to any particular computer or other apparatus. Various general-purpose systems may be used with programs and modules in accordance with the teachings herein, or it may prove convenient to construct a more specialized apparatus to perform desired method steps. In addition, the present invention is not described with reference to any particular programming language. It will be appreciated that a variety of programming languages may be used to implement the teachings of the invention as described herein. The instructions of the programming language(s) may be executed by one or more processing devices, e.g., central processing units (CPUs), processors, or controllers.

Exemplary embodiments of the invention, as will be described in greater detail below, provide apparatuses, methods and computer programs for a packet encoding scheme to ensure unequal error protection to different bits in a packet or in multiple packets.

In one exemplary embodiment, the structure of Gray encoding is used to ensure unequal error protection for different bits. The packet encoding scheme generates a symbol using a mix of high priority and low priority bits. This is achieved as follows: (a) Scramble an input bit stream (consisting of high priority bits followed by low priority bits). (b) Separate out high priority bits from low priority bits in the scrambled bit stream to produce a high priority bit stream and a low priority bit stream. (c) Process the bit stream (consisting of high priority bits followed by low priority bits) to generate a modified bit stream where each block of M bits (where M is constellation size representing bits/symbol) comprises high priority bits as MSBs (Most Significant Bits) and low priority bits as LSBs (Least Significant Bits). The fewer the number of high priority bits in the MSB, the higher is the error protection for them. (d) Encode the bits using Gray encoding and process the resulting symbols for transmission. At the receiving end, the above operations are performed in reverse to retrieve the transmitted bits.

FIG. 1 shows an example of a typical communication system having a bit scrambler followed by a modulation mapper. The input bits from the bit scrambler are encoded in the modulation mapper using the Gray encoding method to minimize bit error probability in case a symbol is incorrectly detected as a neighboring one. The encoded bits are processed for transmission and then transmitted to the communication medium. The above operations are performed in reverse to retrieve the transmitted bits in an output bit stream. That is, the bits from the communication medium pass through receiver processing, are decoded in a demodulation unit, and then descrambled by a bit scrambler to generate the output bit stream.

Figure 2:
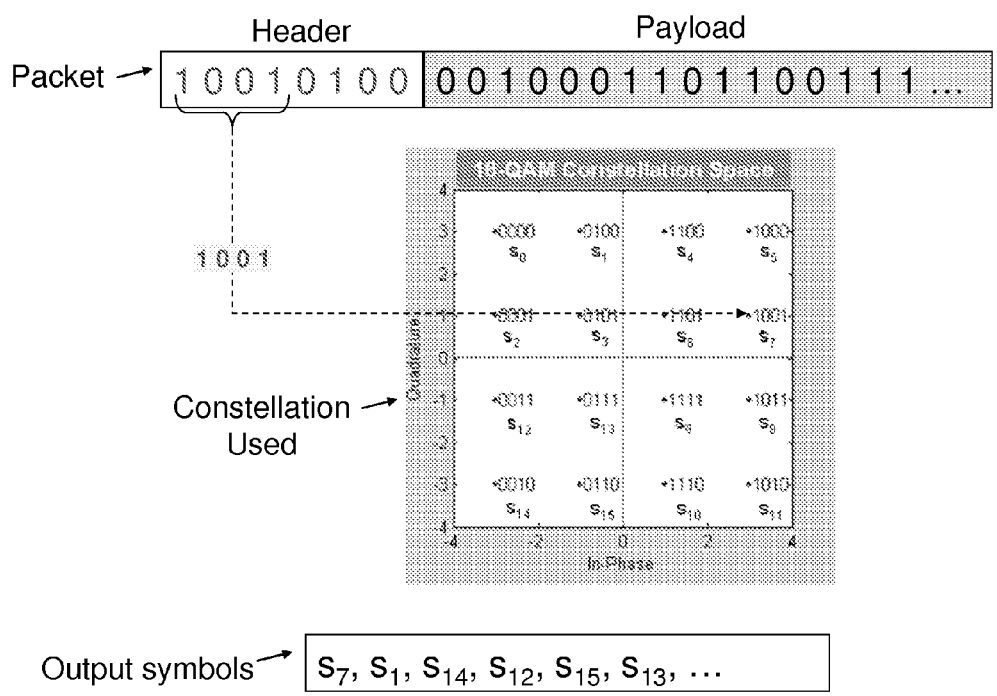
FIG. 2 illustrates an example of the packet encoding and, more specifically, bits-to-symbol mapping after scrambling process.

FIG. 2 illustrates an example of the packet encoding and, more specifically, bits-to-symbol mapping after scrambling process. In this example, the header bits are encoded together followed by the payload bits. The bits forming the MSB of encoded data are usually more robust to noise corruption as compared to LSB bits. This results in unequal error protection for different bits irrespective for the importance of their correction detection. The Gray encoding scheme ensures that the number of differing bits in neighboring symbols is always 1. This reduces the bit error rate in case a symbol is wrongly detected as a neighboring symbol.

Figure 3:
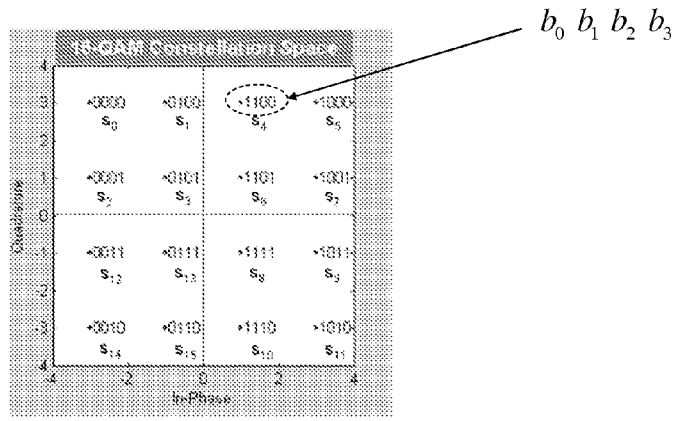
FIG. 3 illustrates an example of the packet encoding for bits-to-symbol mapping to provide unequal error protection in a communication system according to an embodiment of the present invention.

FIG. 3 illustrates an example of the packet encoding for bits-to-symbol mapping to provide unequal error protection in a communication system according to an embodiment of the present invention. In this invention, we utilize the fact that the error probabilities for a bit in a given symbol depends on the relative location of that bit within the symbol (especially for a higher order constellation such as 16-QAM or 64-QAM). As an example, FIG. 3 shows the QAM-16 constellation map with Gray encoded symbols. It is apparent that the probability of error for a MSB bit in a symbol lying on the edge of constellation (for example: s0, s1, s4, s5 and so on) is lower than that for a LSB bit. To be more specific, the probability of correction detection for different bits in an edge symbol follows the following order:

$$Pr(b_0) > Pr(b_1) > Pr(b_2) > Pr(b_3) \qquad (1)$$

This concept illustrated by FIG. 3 along with Equation (1) is used to design a system that can provide unequal error protection to the bits within a packet. When a given bit stream is encoded using Gray Encoding, some of the generated symbols may lie on the edges of the constellation map (depending upon the exact bits being encoded). If that happens, then the bits occupying the leftmost positions will be protected more compared to rightmost bits. On the other hand, if the generated symbol is not on the edge, all bits will have equal chances to get corrupted. According to specific embodiments of this invention, we propose to always place the "high priority" bits at the leftmost positions. This will ensure that the "high priority" bits get more or equal protection compared to "low priority" bits depending upon if the generated symbol lies on the edge or not.

In a constellation map, the constellation points that are closest to a given constellation point are its neighbors. If all constellation points have an equal number of neighbors, the map is a lower order constellation map. If some constellation points (especially the ones located on the edges) have fewer number of neighbors than other constellation points on the map (e.g., those not on the edges), the map is a higher order constellation map. The unequal error protection benefits of the present packet encoding scheme are seen in higher order constellation such as 16-QAM or 64-QAM, but little or no obvious benefits are found when lower order constellation is used (e.g., BPSK, QPSK, QAM-4, and the like).

A. Separating High and Low Priority Bits

Figure 4:
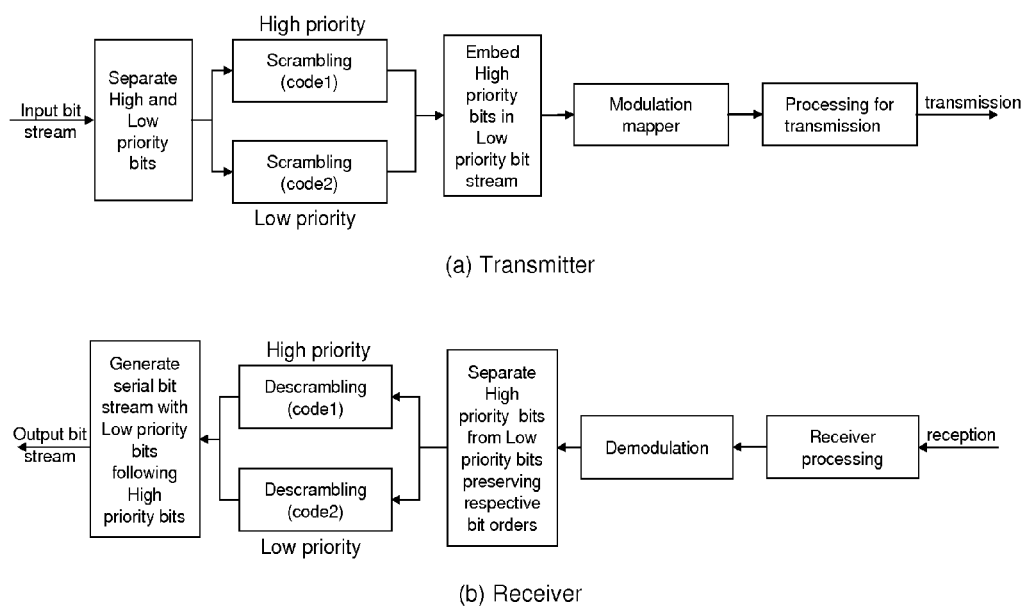
FIG. 4 is a schematic diagram of a communication system illustrating an example of multi-level scrambling to facilitate appropriate bit-to-symbol mapping for unequal error protection.

FIG. 4 is a schematic diagram of a communication system illustrating an example of multi-level scrambling to facilitate appropriate bit-to-symbol mapping for unequal error protection. FIG. 4a shows a transmitter which includes a processor, a memory, and a plurality of modules for processing bits in a transmission path. The input bit stream is scrambled by a scrambler. Different from the conventional communication system described in FIG. 1, it is proposed to split up the bit stream in accordance with different priority levels in a transmitter separation module and rearrange them in a transmitter rearranging module as discussed in more detail below. The modified bit stream is then encoded by a modulation mapper and then processed for transmission. FIG. 4b shows a receiver which includes a processor, a memory, and a plurality of modules for processing bits in the return reception path. The bit stream undergoes receiver processing and then demodulation in a demodulation module. The high priority bits in the demodulated/decoded bit stream are separated from the low priority bits in a receiver separation module while preserving respective bit orders. The next step is to generate a serial bit stream with low priority bits following high priority bits in a receiver rearranging module. The resulting bit stream is descrambled in a descrambler to produce the output bit stream.

B. Embedding of Bits for Bits-to-Symbol Mapping

After separating the high priority bits from the low priority bits, they are rearranged so that the order of bits in any given stream remains unchanged while high priority bits are embedded so as to retain higher protection against noise. As such, each block of M bits may have bits belonging to different priority levels. For example, the MSB bits may be the ones belonging to the highest priority bit stream whereas lowest priority bits may form the LSB bits.

Figure 5:
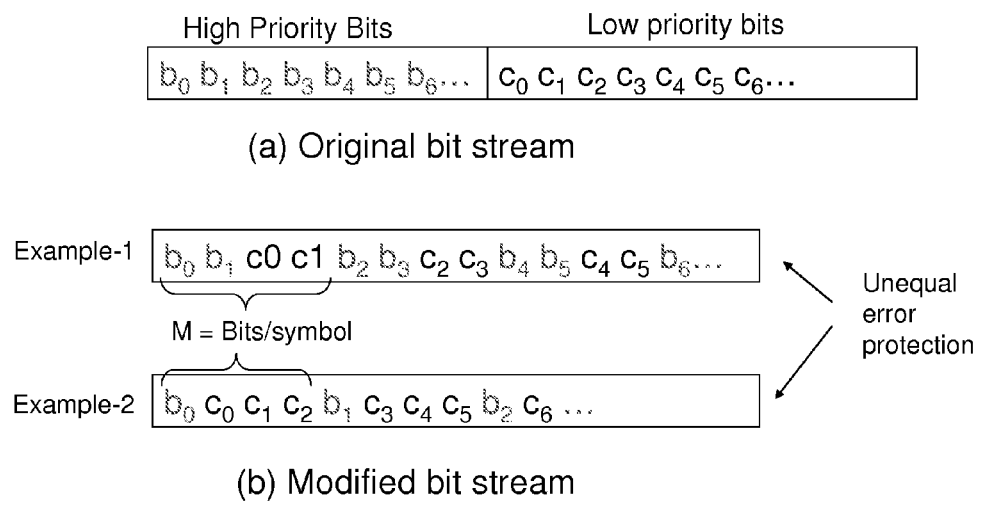
FIG. 5 shows an example illustrating how to embed higher priority bits within a low priority bit stream.

FIG. 5 shows an example illustrating how to embed higher priority bits within a low priority bit stream. Two examples are presented and both preserve the respective bit orders in the "High priority" and "Low priority" bit streams. Example-2 provides a higher level of protection to the "High priority" bits as compared to Example-1.

C. Encoding the Modified Bit Stream

Once the bits from different priority levels are rearranged, the resulting bit stream may be encoded using the Gray encoding method. In the following we provide several examples to illustrate different use cases.

Figure 6:
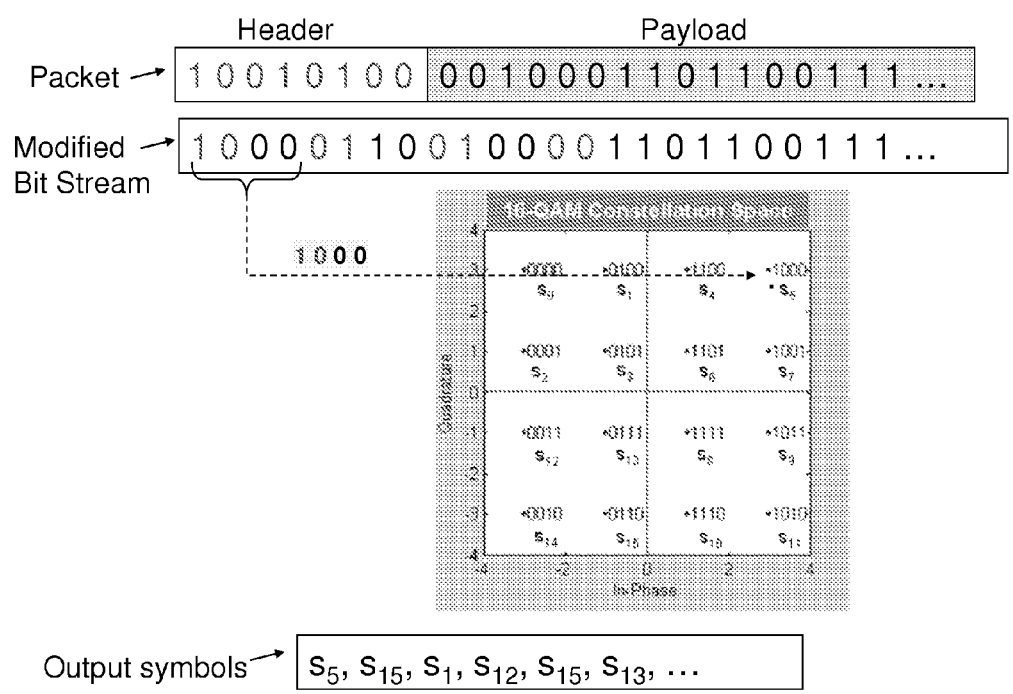
FIG. 6 shows a first example of applying the present packet encoding scheme to provide more protection to the Header bits of the packet.

FIG. 6 shows a first example of applying the present packet encoding scheme to provide more protection to the Header bits of the packet. Each block of 4 bits is formed using 2 bits from the header stream occupying first and second leftmost positions. The other two are formed from the payload bits. This ensures that the header bits are less prone to incorrect detection as compared to the payload bits. Once all header bits are used up, the payload bits are encoded as usual.

Figure 7:
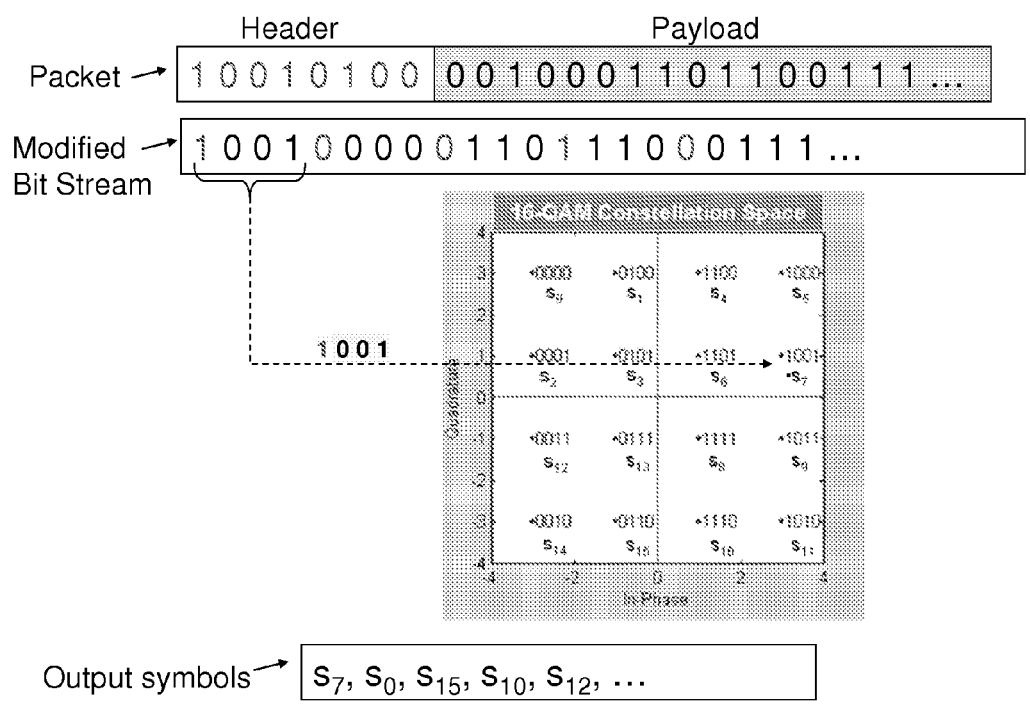
FIG. 7 shows a second example of applying the present packet encoding scheme to provide more protection to the Header bits of the packet which has a higher level of error protection than that in the first example of FIG. 6.

FIG. 7 shows a second example of applying the present packet encoding scheme to provide more protection to the Header bits of the packet which has a higher level of error protection than that in the first example of FIG. 6. FIG. 7 considers the same scenario as that in FIG. 6 but each block of 4 bits is formed using 1 bit from the header stream occupying the leftmost position and the remaining 3 bits are from the payload bit stream. This ensures that the header bits receive more protection than the example illustrated in FIG. 6. Once all the header bits are used up, the payload bits are encoded as usual.

Figure 8:
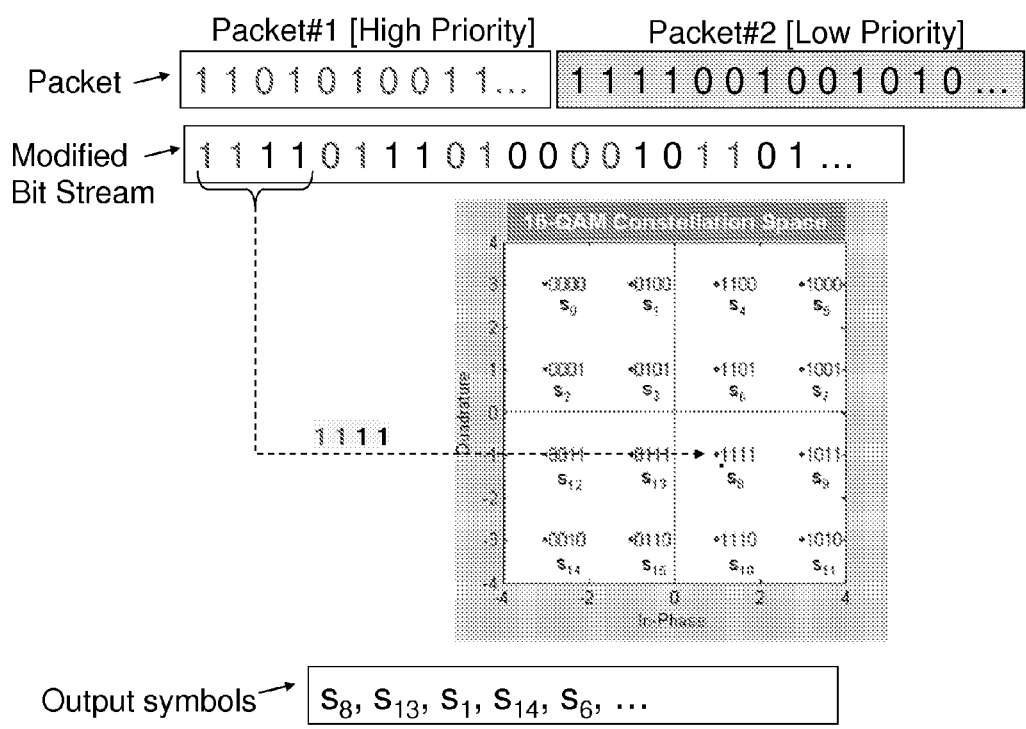
FIG. 8 shows a third example of applying the present packet encoding scheme to provide more protection to the Header bits of the packet illustrating unequal error protection for different packets intended for the same use or different users.

FIG. 8 shows a third example of applying the present packet encoding scheme to provide more protection to the Header bits of the packet illustrating unequal error protection for different packets intended for the same use or different users. The high priority bits are from a high priority packet (number 1) and the low priority bits are from a low priority packet (number 2). Each block of 4 bits is formed using 2 bits from the high priority packet bit stream occupying the leftmost position and 2 bits from the low priority packet bit stream occupying the rightmost position. This ensures that the high priority packet bits receiver more protection than the low priority packet bits.

The present packet encoding scheme can find application in both wired and wireless communication systems. It can provide unequal error protection at insignificant complexity. Some of the possible use-scenarios include higher protection to header of a packet, higher protection to I-frames of MPEG application, higher protection to control packets, and the like.

The computers and storage systems implementing the invention can also have known I/O devices (e.g., CD and DVD drives, floppy disk drives, hard drives, etc.) which can store and read the modules, programs and data structures used to implement the above-described invention. These modules, programs and data structures can be encoded on such computer-readable media. For example, the data structures of the invention can be stored on computer-readable media independently of one or more computer-readable media on which reside the programs used in the invention. The components of the system can be interconnected by any form or medium of digital data communication, e.g., a communication network. Examples of communication networks include local area networks, wide area networks, e.g., the Internet, wireless networks, storage area networks, and the like.

In the description, numerous details are set forth for purposes of explanation in order to provide a thorough understanding of the present invention. However, it will be apparent to one skilled in the art that not all of these specific details are required in order to practice the present invention. It is also noted that the invention may be described as a process, which is usually depicted as a flowchart, a flow diagram, a structure diagram, or a block diagram. Although a flowchart may describe the operations as a sequential process, many of the operations can be performed in parallel or concurrently. In addition, the order of the operations may be re-arranged.

As is known in the art, the operations described above can be performed by hardware, software, or some combination of software and hardware. Various aspects of embodiments of the invention may be implemented using circuits and logic devices (hardware), while other aspects may be implemented using instructions stored on a machine-readable medium (software), which if executed by a processor, would cause the processor to perform a method to carry out embodiments of the invention. Furthermore, some embodiments of the invention may be performed solely in hardware, whereas other embodiments may be performed solely in software. Moreover, the various functions described can be performed in a single unit, or can be spread across a number of components in any number of ways. When performed by software, the methods may be executed by a processor, such as a general purpose computer, based on instructions stored on a computer-readable medium. If desired, the instructions can be stored on the medium in a compressed and/or encrypted format.

From the foregoing, it will be apparent that the invention provides methods, apparatuses and programs stored on computer readable media for a packet encoding scheme to ensure unequal error protection to different bits in a packet or in multiple packets. Additionally, while specific embodiments have been illustrated and described in this specification, those of ordinary skill in the art appreciate that any arrangement that is calculated to achieve the same purpose may be substituted for the specific embodiments disclosed. This disclosure is intended to cover any and all adaptations or variations of the present invention, and it is to be understood that the terms used in the following claims should not be construed to limit the invention to the specific embodiments disclosed in the specification. Rather, the scope of the invention is to be determined entirely by the following claims, which are to be construed in accordance with the established doctrines of claim interpretation, along with the full range of equivalents to which such claims are entitled.

What is claimed is:

1. A method to process bits in a bit stream, the method comprising:
    scrambling the bit stream;
    separating the scrambled bit stream into separate high priority bits and low priority bits to form a high priority bit stream and a low priority bit stream, the high priority bit stream having an order of high priority bits from left to right and the low priority bit stream having an order of low priority bits from left to right;

rearranging the bits by embedding the high priority bits from the high priority bit stream in the low priority bit stream to form a rearranged bit stream while preserving the order of the high priority bits and the order of the low priority bits in the rearranged bit stream, the rearranged bit stream including blocks of bits, each block including one or more adjacent high priority bits disposed left of corresponding one or more adjacent low priority bits in order to provide protection for the high priority bits against noise which is at least equal to protection for the low priority bits in the block;

modulating the rearranged bit stream using Gray encoding method to produce an encoded bit stream; and transmitting the encoded bit stream to a communication medium.

2. The method of claim 1, wherein bits-to-symbol mapping of the encoded bit stream provides a constellation map having edge symbols and non-edge symbols, each symbol including a plurality of bits; and wherein probability of correction detection for the bits in each edge symbol is highest for the leftmost bit and decreases from left to right to lowest for the rightmost bit.

3. The method of claim 1, wherein at least one block of bits in the rearranged bit stream includes one or more adjacent high priority bits from most significant bits of the bit stream and corresponding one or more adjacent low priority bits from least significant bits of the bit stream.

4. The method of claim 1, wherein rearranging the bits comprises generating blocks of M bits wherein M is constellation size representing bits per symbol, each block of M bits including the one or more adjacent high priority bits to the left of the corresponding one or more adjacent low priority bits.

5. The method of claim 1, wherein the bit stream comprises a packet having header bits and payload bits, the header bits being high priority bits, the payload bits being low priority bits.

6. The method of claim 1, wherein the bit stream comprises a high priority packet having the high priority bits and a low priority packet having the low priority bits.

7. The method of claim 1, further comprising:

receiving an input encoded bit stream from the communication medium, the input encoded bit stream including a plurality of high priority encoded bits embedded in a plurality of low priority encoded bits, the high priority encoded bits having an input order of high priority bits from left to right, the a low priority encoded bits having an input order of low priority bits from left to right;

demodulating the input encoded bit stream to produce a decoded bit stream;

separating the decoded bit stream into separate high priority decoded bits and low priority decoded bits to form a high priority decoded bit stream and a low priority decoded bit stream while preserving the input order of the high priority bits in the high priority decoded bit stream and the input order of the low priority bits in the low priority decoded bit stream, generating a serial bit stream with the high priority decoded bit stream which is followed by the low priority decoded bit stream; and descrambling the serial bit stream.

8. A system to process bits in a bit stream, the system comprising:

a scrambler to scramble the bit stream;

a transmitter separation module to separate the scrambled bit stream into separate high priority bits and low priority bits to form a high priority bit stream and a low priority bit stream, the high priority bit stream having an order of high priority bits from left to right and the low priority bit stream having an order of low priority bits from left to right;

a transmitter rearranging module to rearrange the bits by embedding the high priority bits from the high priority bit stream in the low priority bit stream to form a rearranged bit stream while preserving the order of the high priority bits and the order of the low priority bits in the rearranged bit stream, the rearranged bit stream including blocks of bits, each block including one or more adjacent high priority bits disposed left of corresponding one or more adjacent low priority bits in order to provide protection for the high priority bits against noise which is at least equal to protection for the low priority bits in the block;

a modulation mapper to modulate the rearranged bit stream using Gray encoding method to produce an encoded bit stream; and a transmitter to transmit the encoded bit stream to a communication medium.

9. The system of claim 8, wherein bits-to-symbol mapping of the encoded bit stream provides a constellation map having edge symbols and non-edge symbols, each symbol including a plurality of bits; and wherein probability of correction detection for the bits in each edge symbol is highest for the leftmost bit and decreases from left to right to lowest for the rightmost bit.

10. The system of claim 8, wherein at least one block of bits in the rearranged bit stream includes one or more adjacent high priority bits from most significant bits of the bit stream and corresponding one or more adjacent low priority bits from least significant bits of the bit stream.

11. The system of claim 8, wherein rearranging the bits comprises generating blocks of M bits wherein M is constellation size representing bits per symbol, each block of M bits including the one or more adjacent high priority bits to the left of the corresponding one or more adjacent low priority bits.

12. The system of claim 8, wherein the bit stream comprises a packet having header bits and payload bits, the header bits being high priority bits, the payload bits being low priority bits.

13. The system of claim 8, wherein the bit stream comprises a high priority packet having the high priority bits and a low priority packet having the low priority bits.

14. The system of claim 8, further comprising:

a receiver to receive an input encoded bit stream from the communication medium, the input encoded bit stream including a plurality of high priority encoded bits embedded in a plurality of low priority encoded bits, the high priority encoded bits having an input order of high priority bits from left to right, the a low priority encoded bits having an input order of low priority bits from left to right;

a demodulation module to demodulate the input encoded bit stream to produce a decoded bit stream;

a receiver separation module to separate the decoded bit stream into separate high priority decoded bits and low priority decoded bits to form a high priority decoded bit stream and a low priority decoded bit stream while preserving the input order of the high priority bits in the high priority decoded bit stream and the input order of the low priority bits in the low priority decoded bit stream;

a receiver rearranging module to generating a serial bit stream with the high priority decoded bit stream which is followed by the low priority decoded bit stream; and a descrambler to descramble the serial bit stream.

15. A computer-readable storage medium storing a plurality of instructions for controlling a data processor to process bits in a bit stream, the plurality of instructions comprising:

instructions that cause the data processor to scramble the bit stream;

instructions that cause the data processor to separate the scrambled bit stream into separate high priority bits and low priority bits to form a high priority bit stream and a low priority bit stream, the high priority bit stream having an order of high priority bits from left to right and the low priority bit stream having an order of low priority bits from left to right;

instructions that cause the data processor to rearrange the bits by embedding the high priority bits from the high priority bit stream in the low priority bit stream to form a rearranged bit stream while preserving the order of the high priority bits and the order of the low priority bits in the rearranged bit stream, the rearranged bit stream including blocks of bits, each block including one or more adjacent high priority bits disposed left of corresponding one or more adjacent low priority bits in order to provide protection for the high priority bits against noise which is at least equal to protection for the low priority bits in the block; and instructions that cause the data processor to modulate the rearranged bit stream using Gray encoding method to produce an encoded bit stream.

16. The computer-readable storage medium of claim 15, wherein bits-to-symbol mapping of the encoded bit stream provides a constellation map having edge symbols and non-edge symbols, each symbol including a plurality of bits; and wherein probability of correction detection for the bits in each edge symbol is highest for the leftmost bit and decreases from left to right to lowest for the rightmost bit.

17. The computer-readable storage medium of claim 15, wherein at least one block of bits in the rearranged bit stream includes one or more adjacent high priority bits from most significant bits of the bit stream and corresponding one or more adjacent low priority bits from least significant bits of the bit stream.

18. The computer-readable storage medium of claim 15, wherein rearranging the bits comprises generating blocks of M bits wherein M is constellation size representing bits per symbol, each block of M bits including the one or more adjacent high priority bits to the left of the corresponding one or more adjacent low priority bits.

19. The computer-readable storage medium of claim 15, wherein the bit stream comprises a packet having header bits and payload bits, the header bits being high priority bits, the payload bits being low priority bits.

20. The computer-readable storage medium of claim 15, further comprising:

instructions that cause the data processor to demodulate an input encoded bit stream from the communication medium to produce a decoded bit stream, the input encoded bit stream including a plurality of high priority encoded bits embedded in a plurality of low priority encoded bits, the high priority encoded bits having an input order of high priority bits from left to right, the a low priority encoded bits having an input order of low priority bits from left to right;

instructions that cause the data processor to separate the decoded bit stream into separate high priority decoded bits and low priority decoded bits to form a high priority decoded bit stream and a low priority decoded bit stream while preserving the input order of the high priority bits in the high priority decoded bit stream and the input order of the low priority bits in the low priority decoded bit stream, instructions that cause the data processor to generating a serial bit stream with the high priority decoded bit stream which is followed by the low priority decoded bit stream; and instructions that cause the data processor to descramble the serial bit stream.

\* \* \* \* \*